(12) United States Patent
Ludden et al.

(10) Patent No.: US 6,861,886 B1
(45) Date of Patent: Mar. 1, 2005

(54) CLOCK DESKEW PROTOCOL USING A DELAY-LOCKED LOOP

(75) Inventors: Christopher A. Ludden, Pittsford, NY (US); Richard Alexander Erhart, Tempe, AZ (US); Mark D. Kuhns, Peoria, AZ (US); Arif Alam, Chandler, AZ (US)

(73) Assignee: National Semiconductor Corporation, Santa Clara, CA (US)

( * ) Notice: Subject to any disclaimer, the term of this patent is extended or adjusted under 35 U.S.C. 154(b) by 5 days.

(21) Appl. No.: 10/443,458

(22) Filed: May 21, 2003

(51) Int. Cl.[7] .................................................. H03L 7/06
(52) U.S. Cl. ........................ 327/156; 327/144; 327/158; 327/161
(58) Field of Search ................................ 327/144, 145, 327/152, 158, 161–163, 292, 293, 295, 297, 565; 375/354, 355, 371, 373, 376

(56) References Cited

U.S. PATENT DOCUMENTS

| | | | |
|---|---|---|---|
| 6,366,145 B1 * | 4/2002 | Williams et al. ............ | 327/156 |
| 6,429,715 B1 * | 8/2002 | Bapat et al. ................ | 327/295 |
| 6,686,785 B2 * | 2/2004 | Liu et al. .................... | 327/158 |
| 6,693,985 B2 * | 2/2004 | Li et al. ..................... | 375/355 |

OTHER PUBLICATIONS

K. Lee et al., "1.04 GBd Low EMI Digital Video Interface System Using Small Swing Serial Link Technique", IEEE Journal of Solid–State Circuits, vol. 323, No. 5, May 1998.

* cited by examiner

*Primary Examiner*—Vibol Tan
(74) *Attorney, Agent, or Firm*—Darby & Darby P.C.; Matthew M. Gaffney (57) ABSTRACT

A data/clock deskewing methodology uses a delay-locked loop (DLL) circuit. The DLL circuit generates a number of clock phases in response to an input clock, where each clock phase is delayed relative to the input clock signal. The clock phases are used to sample data from a data line. The sampled data is checked against a preamble pattern (a sequence of known data). A digital deskew control block selects one of the clock phases after analyzing the results of preamble pattern check such that subsequently received data is sampled with the appropriately selected clock phase.

20 Claims, 8 Drawing Sheets

CLOCK DESKEW PROTOCOL USING A DELAY-LOCKED LOOP

FIELD OF THE INVENTION

The present invention relates to clock deskewing, and, in particular, to a method and apparatus for clock deskewing by using a delay-lock loop (DLL) circuit that provides multiple clock phases for selection. A data line is sampled using a selected clock phase. The sampled data is compared to a preamble pattern to determine an appropriate clock phase for the data that follows.

BACKGROUND OF THE INVENTION

A conventional electronic system may employ a receiver and transmitter pair to send data that is synchronized with a clock signal. A non-ideal skew may occur between the data transmission and the clock signal. The non-ideal skew is often the result of transmission dissimilarities between the clock and data signals because of various transmission characteristics. Example transmission characteristics that are problematic may include signal routing geometry, length of the signal lines, impedance of the signal lines, loading on the signal lines, as well as differences in the delay paths of the clock and data signals for the transmitter and receiver. The maximum reliable transmission speed between the transmitter and receiver is limited by the clock/data skew characteristics.

BRIEF DESCRIPTION OF THE DRAWINGS

Non-limiting and non-exhaustive embodiments of the present invention are described with reference to the following drawings.

DETAILED DESCRIPTION OF THE PREFERRED EMBODIMENT

Throughout the specification and claims, the following terms take the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, charge, temperature, or data signal. Referring to the drawings, like numbers indicate like parts throughout the views.

System Overview

Briefly stated, the present invention is related to a data/clock deskewing methodology that uses a delay-locked loop (DLL) circuit. The DLL circuit generates a number of clock phases in response to an input clock, where each clock phase is delayed relative to the input clock signal. The clock phases are used to sample data from a data line. The sampled data is checked against a preamble pattern (a sequence of known data). A digital deskew control block selects one of the clock phases after analyzing the results of preamble pattern check such that subsequently received data is sampled with the appropriately selected clock phase.

The digital deskew control block is arranged to review the results of preamble pattern checking and select an appropriate clock phase based on the algorithmic methodology. The algorithm may be implemented as hardware, software, or a combination of hardware and software. The resulting selected clock phase should correspond to the most appropriate clock phase from all of the available clock phases that are provided by the DLL circuit.

Example Systems

Figure 1A:
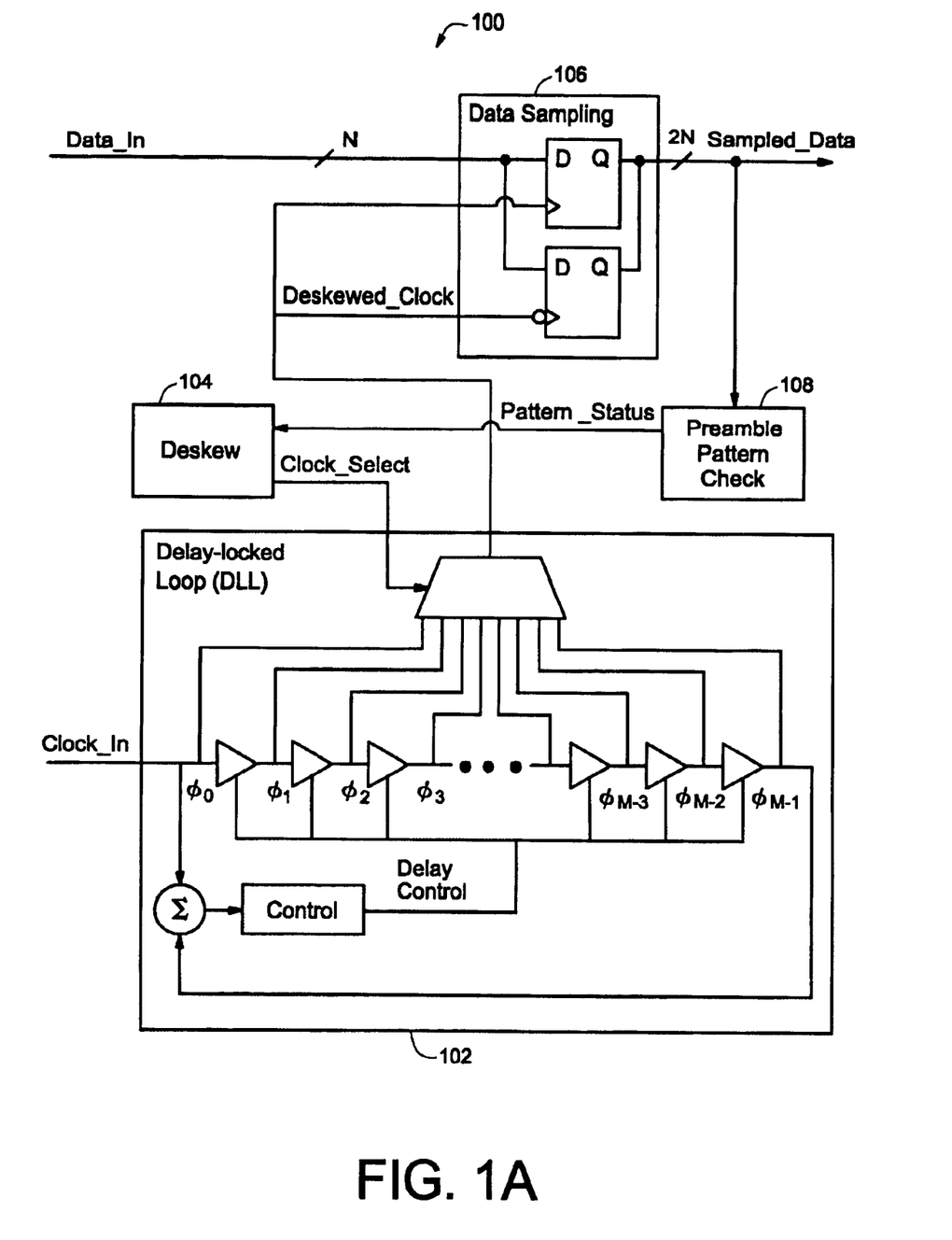
FIG. 1A is an illustration of a block diagram for an example clock/data deskew circuit.

FIG. 1A is an illustration of a block diagram for an example clock/data deskew circuit (100) that is arranged in accordance with aspects of the present invention. Circuit 100 includes DLL circuit 102, deskew control block 104, preamble pattern check block 106, and data sampling block 108.

DLL circuit 102 is arranged to provide a series of clock phases in response to a clock input signal (Clock_In). The clock phases are adjusted by the DLL circuit (102) such that the phases span one clock period of Clock_In. DLL circuit 102 selects one of the clock phases (Deskewed_Clock) in response to a clock select signal (Clock_Select). Data sampling block 106 is arranged to sample data (Data_In) using Deskewed_Clock, and provide sampled data (Sampled_Data). Preamble pattern check block (108) is arranged to provide a status (Pattern_Status) to the deskew control block (104) in response to Sampled_Data. Deskew Control Block 104 is arranged to analyze Pattern_Status to determine the appropriate clock phase selection, and to provide the clock select signal (Clock_Select) such that the clock select signal corresponds to the appropriate clock phase.

The system is operated over two basic time intervals that makeup the data frame transmission cycle. A first time interval corresponds to an adjustment interval, where decisions are made to select an appropriate clock phase for sampling. A second time interval corresponds to a data-sampling interval, where Data_In corresponds to "live" data that is sampled using the selected clock phase. The operating intervals are described in further detail below with reference to FIG. 3.

Figure 1B:
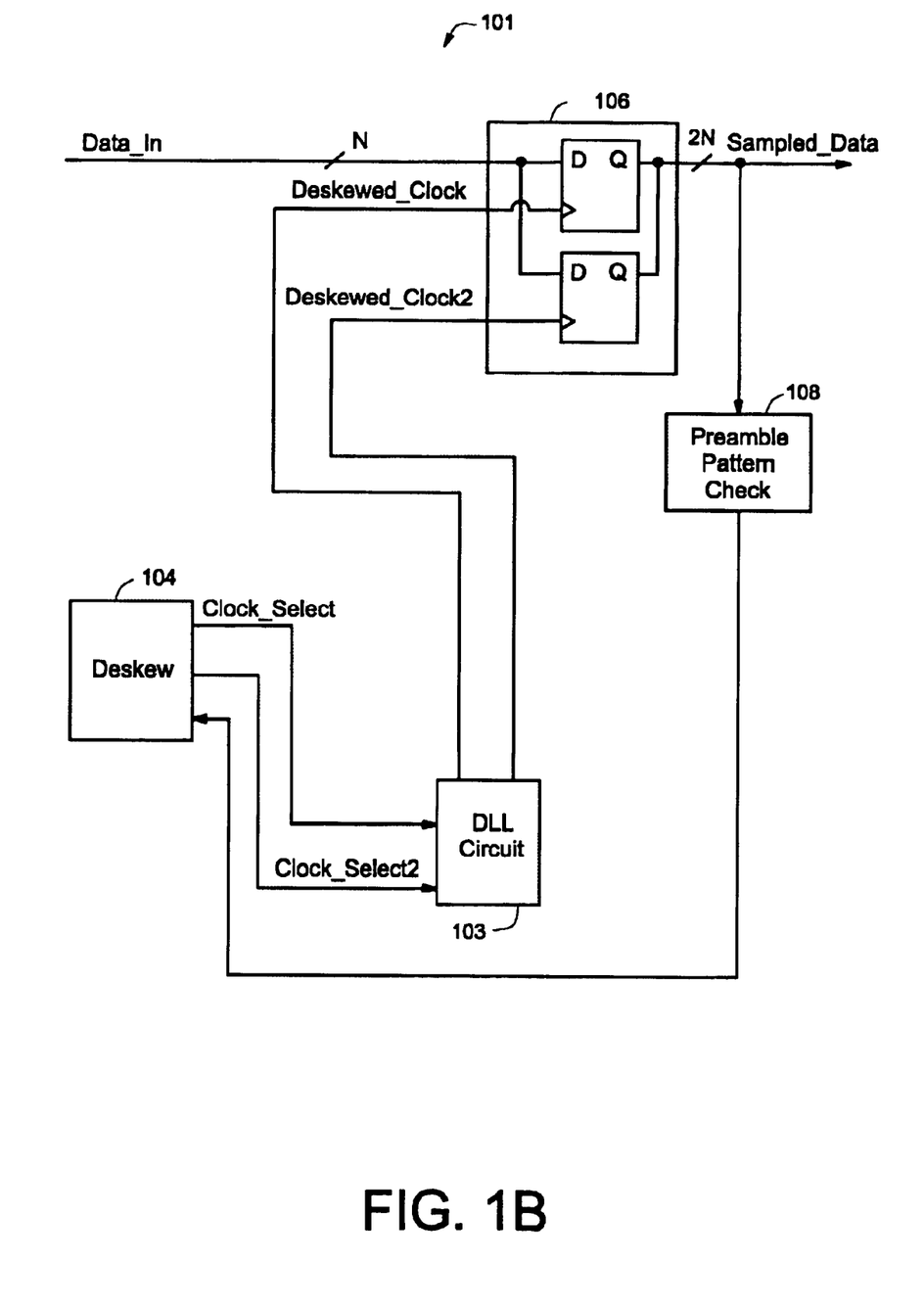
FIG. 1B is an illustration of a block diagram for another example clock/data deskew circuit.

FIG. 1B is an illustration of a block diagram for another example clock/data deskew circuit (101) that is arranged in accordance with aspects of the present invention. DLL circuit 103 is arranged to select a clock phase (Clock_Select) in response to a clock select signal (Clock_Select), in a similar manner as DLL circuit 102. DLL circuit 103 is further arranged to select another of the clock phases (Deskewed_Clock2) in response to another clock select signal (Clock_Select2). Data sampling block 108 is arranged to sample the data (Data_In) using Deskewed_

Clock to provide N bits of the sampled data (Sampled_Data) that correspond to one edge of the clock, and using Deskewed_Clock2 to provide another N bits of the sampled data (Sampled_Data) that correspond to another edge of the clock. Deskew Control Block 104 is further arranged to provide signal Clock_Select2 to determine the appropriate clock phase selection for Deskewed_Clock2.

DLL Clock Phase Generation

DLL circuit 102 is arranged to produces a fixed number (M) of equally spaced clock phases ($\emptyset_0, \emptyset_1, \ldots, \emptyset_{M-1}$) in response to the input clock signal (Clock_In). The total delay of the clock phases (DLL input to DLL output) is equal to an integral number (M) of data bit periods. The delay time for each of the clock phases is adjusted by the delay control block within the DLL circuit (102). The output signal (Deskewed_Clock) of DLL circuit 102 is selected among the generated phases in response to Clock_Select, as illustrated in the figure.

Figure 2:
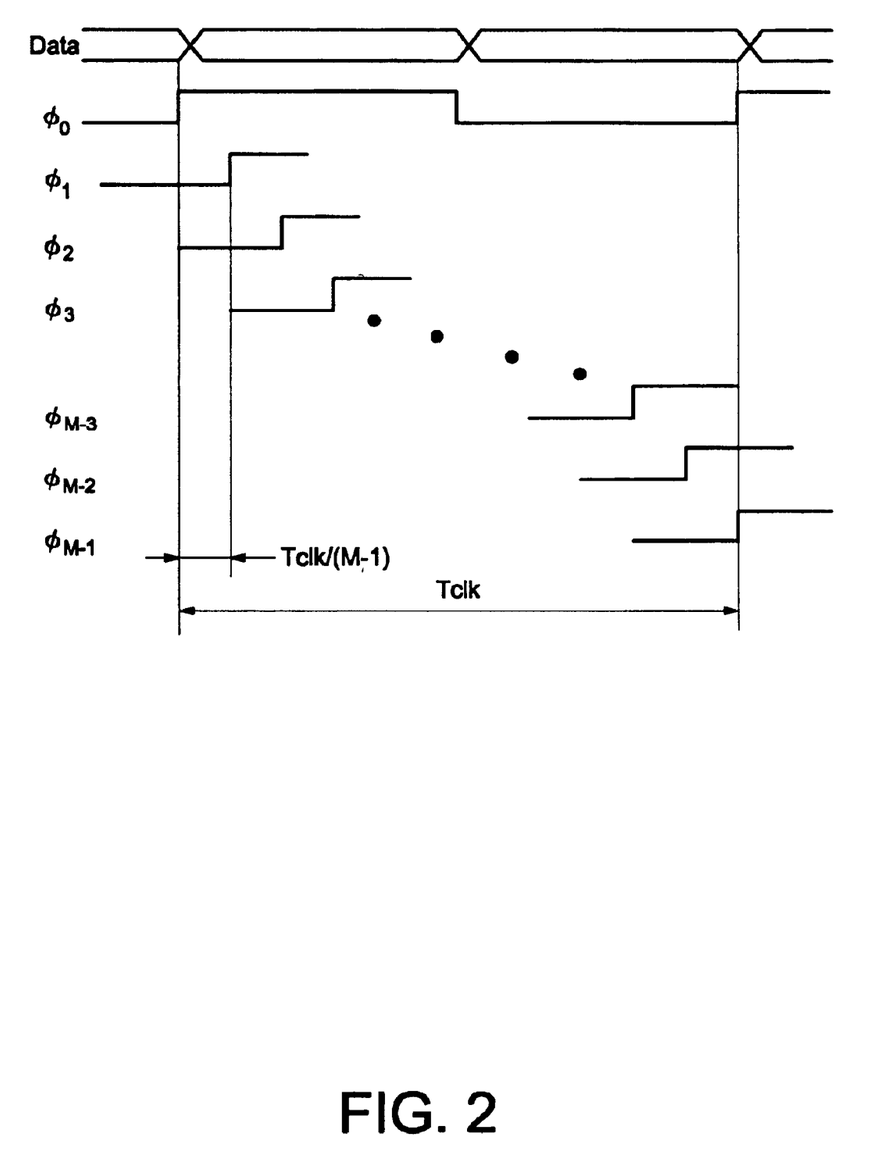
FIG. 2 is an illustration of a timing diagram of clock phases that are generated by an example DLL circuit.

FIG. 2 is an illustration of a timing diagram of clock phases that are generated by an example DLL circuit (e.g., DLL circuit 102). As shown in the figure, M phases (i.e., $\emptyset_0, \emptyset_1, \ldots, \emptyset_{M-1}$) span two data bit periods that correspond to a single clock cycle ($T_{clk}$). The input phase ($\emptyset_0$) corresponds to signal Clock_In, while phases $\emptyset_1$ through $\emptyset_{M-1}$ are sequentially delayed in time relative to phase $\emptyset_0$. The last phase ($\emptyset_{M-1}$) is aligned in time with phase $\emptyset_0$. Deskew control block 104 is arranged to select one of these phases as the sampling clock (Deskewed_Clock) for the received data (Data_In) via the clock select signal (Clock_Select).

According to one example, the clock and the incoming data may be skewed by +/−0.5 data bit period. For this example, the DLL should provide clock phases that span 2 data bit periods so that the sampling clock (the deskewed clock) has sufficient resolution to align in time with the center of the incoming data. The required span (N) for the phases provided by the DLL may be expressed as: N=1+2*Skew, where Skew is the maximum amount of data/clock skew (+/−) in terms of data bit periods. Thus, a Skew=±1 bit period results in a DLL span of 3 bit periods, while a Skew=±1.5 bit periods results in a DLL spans of 4 bit periods. Alternatively, the DLL span may be different from the above-described expression (1+2*Skew).

Example Protocol

Figure 3:
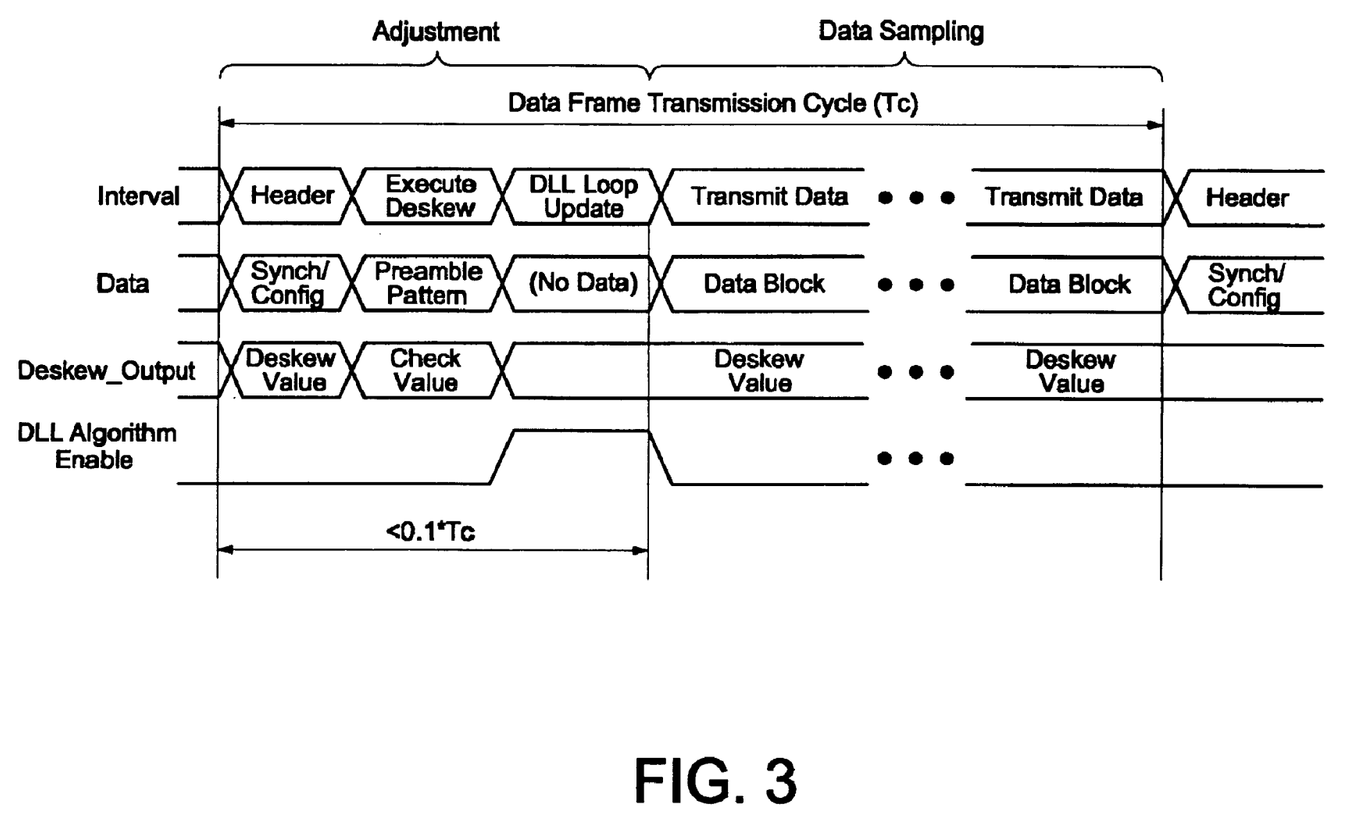
FIG. 3 is an illustration of a timing diagram for an example data frame protocol.

FIG. 3 is an illustration of a timing diagram for an example data frame protocol. As described previously, the system is operated over two basic time intervals that makeup the data frame transmission cycle.

An adjustment time interval is utilized to attend to various overhead and synchronization of the sampling clock prior to "live" data sampling. The "live" data sampling is subsequently performed in a data sampling time interval. The overhead portion of the adjustment time interval can be used for various configuration functions. An example system may have an adjustment time interval that comprises 5% of the data frame transmission cycle. Other example systems may comprises more or less than 5% of the data frame transmission cycle.

The example data protocol illustrated in FIG. 3 includes an adjustment time interval that is broken into three constituent parts: a Header interval, an Execute Deskew interval, and a DLL Loop Update interval. The DLL Loop Update interval may be used by circuit 100 to lock and maintain the DLL (102) to the correct delay per phase. According to one example, Deskewed_Clock is disabled while the frequency control is adjusted (e.g., dynamic refresh of stored charges in the DLL circuit), such that no data is clocked during the DLL Loop Update interval. During an example Header interval, Data_In may contain information that is used to configure the system. During the Excute Deskew interval, Data_In may be arranged to include a preamble pattern, as follows below.

DLL Phase Testing

According to one example, data sampling block 106 is configured to sample a preamble pattern with one of the DLL phases ($\emptyset_0-\emptyset_{M-1}$) during the Execute Deskew interval for each line. The data sampling block (106) is arranged to provide Sampled_Data to the preamble pattern check block (108). Preamble pattern check block 108 evaluates Sampled_Data for each tested DLL phase and provides a corresponding pattern status signal (Pattern_Status) to the deskew control block (104). Each of the DLL phases (phases $\emptyset_0-\emptyset_{M-1}$) is tested using the preamble pattern so that clock phase control is accurate regardless of the nature of the "live" data signals.

According to one example, two data lines may be employed using dual-edge clock sampling with a preamble pattern that is provided over eight clock cycles (e.g., eight symbol times). For this example, 32 symbols are provided in each preamble pattern ([8 symbol times/data line]×[2 bits/symbol time]×[2 data lines]). Other preamble patterns may also be used that have a different number of symbols, and/or a different number of data lines.

The preamble pattern is transmitted over a number of symbol times. The transmitted symbols in the preamble pattern may be arranged to include variations in phase and bit width relative to the symbol times. The variations in phase and bit width are selected to test a variety of potential transmission problems. One example variation is arranged to test different interference patterns between the data lines (e.g., signal crosstalk). Another example is arranged to test variations between adjacent data bits (i.e., adjacent in time) on the same data line. In still another example, the preamble may include data that is in phase with the clock, out of phase with the clock, in phase with each other, out of phase with each other, one bit time wide, and two bit times wide.

According to the example shown in circuit 100, the data is sampled on the rising and falling edge of the clock. The example data sampling block (106) shown in FIG. 1A comprises two D-type flip-flops. One of the D-type flip-flops is triggered on the rising edge of the clock, while the other is triggered on the falling edge of the clock. Circuit 100 may be arranged to sample on a single clock edge, a single logic level (level sensitive instead of edge sensitive), or dual logic levels.

The example data sampling block (106) shown in FIG. 1B comprises two D-type flipflops. A first flip-flop is arranged to sample Data_In with Deskewed_Clock, and as second flip-flop is arranged to sample Data_In with Deskewed_Clock2. Circuit 101 is arranged for clock/data deskewing for input data with dual-edge sampling at a duty cycle that may not be 50%. According to one example, Deskew block 104 is configured to select signal Clock_Select such that signal Clock_Select corresponds to the correct phase for data on the rising edge, and further configured to select signal Clock_Select2 such that signal Clock_Select2 corresponds to the correct phase for data on the falling edge.

DLL Phase Selection

Deskew control block 104 is arranged in cooperation with data sampling block 106 and preamble pattern checking block 108. Deskew control block 104 is arranged to operate according to a digital deskew algorithm (DDA). The result of the digital deskew algorithm (DDA) is the selection of an appropriate clock phase via the clock select signal (Clock_Select). The selection is made according to a chosen sampling objective that is based on the observed data "eye". The data "eye" corresponds to the time interval where a single data element may be validly sampled. One sampling objective is to sample at the center of the data eye by averaging the first and last passing phases of the data eye. Other sampling objectives may also be implemented.

Figure 4:
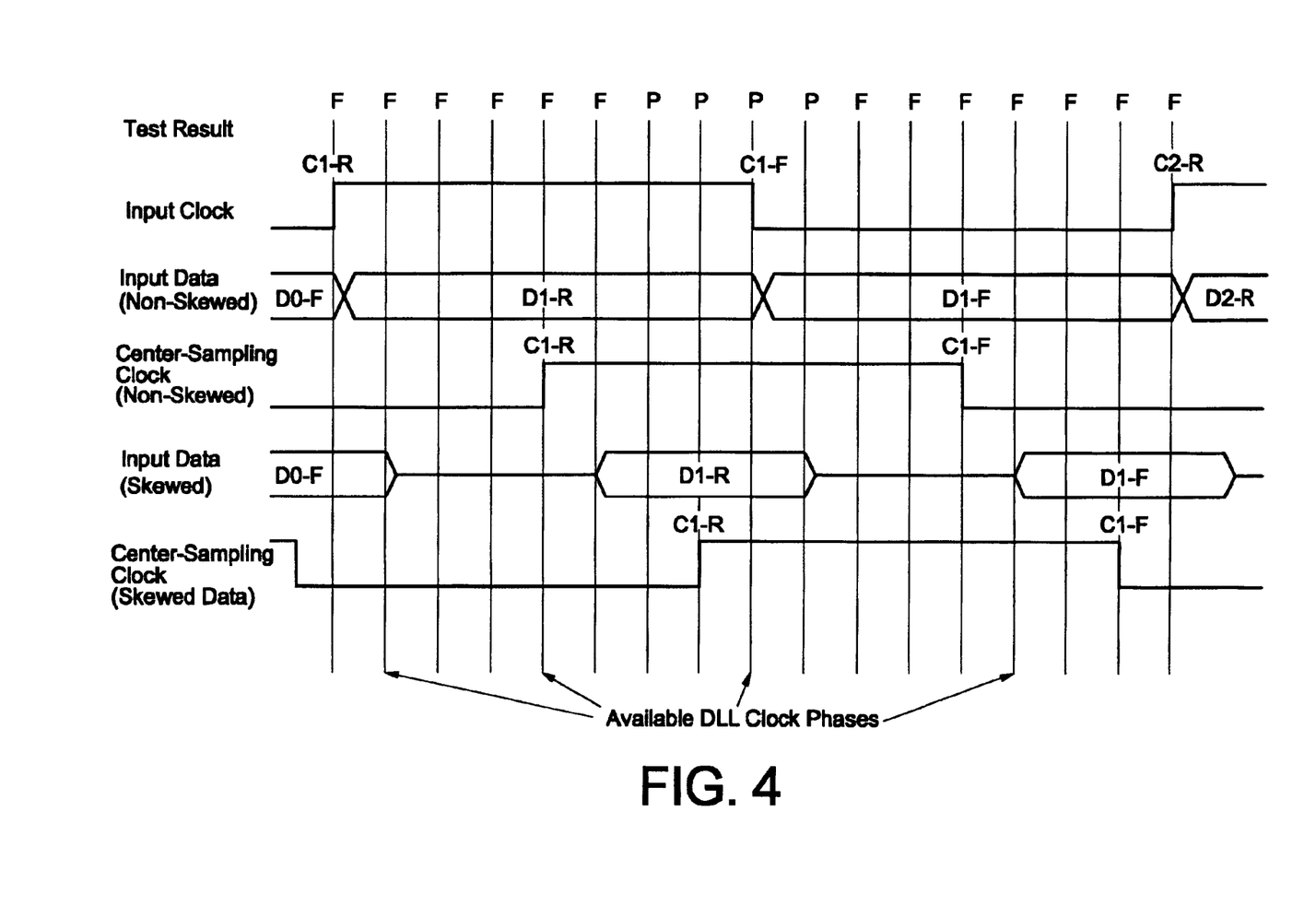
FIG. 4 is an illustration of a timing diagram for an example application of a clock deskewing methodology.

FIG. 4 is an illustration of a timing diagram for an example application of a clock deskewing methodology. For this example, the most appropriate phase is selected based on the center of the data eye in the sampling window. An example input clock is illustrated as "Input Clock". An example of non-skewed input data is shown as "Input Data (non-skewed)". A sampling clock that is centered relative the data eye of the non-skewed input data is shown as "Center-Sampling Clock (non-skewed Data)". An example of skewed input data is shown as "Input Data (skewed)". Another sampling clock that is centered relative to the data eye of the skewed input data is shown as "Center-Sampling Clock (Skewed Data)".

The data is sampled with each of the available clock phases by data sampling block 106 and the resulting sampled data is tested by preamble pattern check block 108 for correctness. Deskew control block 104 receives the results of the test via the pattern status signal (Pattern_Status). Each of the available clock phases from the DLL circuit (102) is illustrated by a vertical bar on the figure. The result of the pattern check for each clock phase is illustrated above the vertical bar by a P (for passing) and an F (for failing). The skewed center-sampling clock is selected to have a rising edge at the midpoint of the first and last passing phases of Input Data(skewed) as illustrated in the figure.

Example Deskew Methodology

Figure 5A:
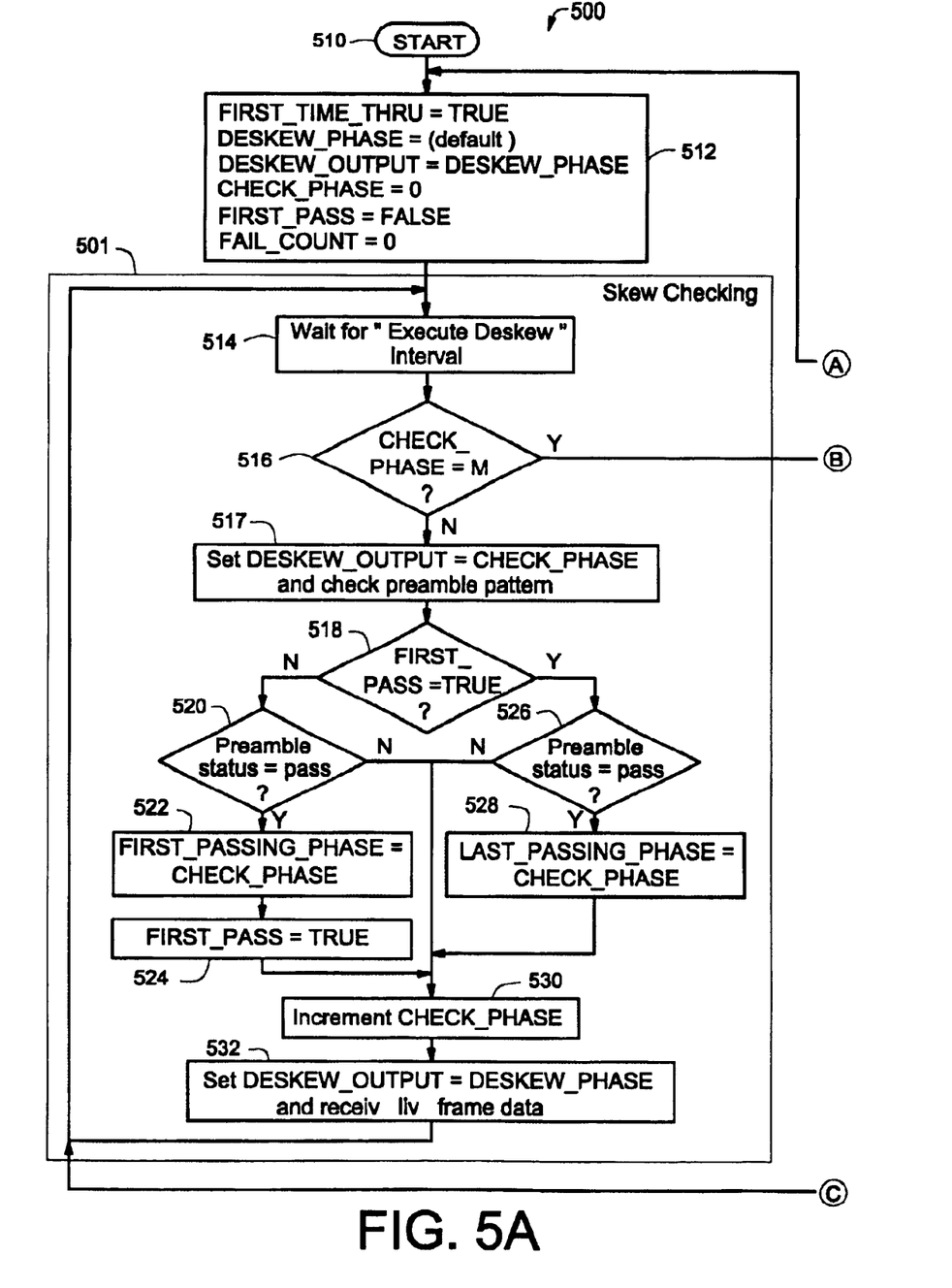
FIG. 5 is an illustration of a flow diagram for an example deskewing methodology.
Figure 5B:
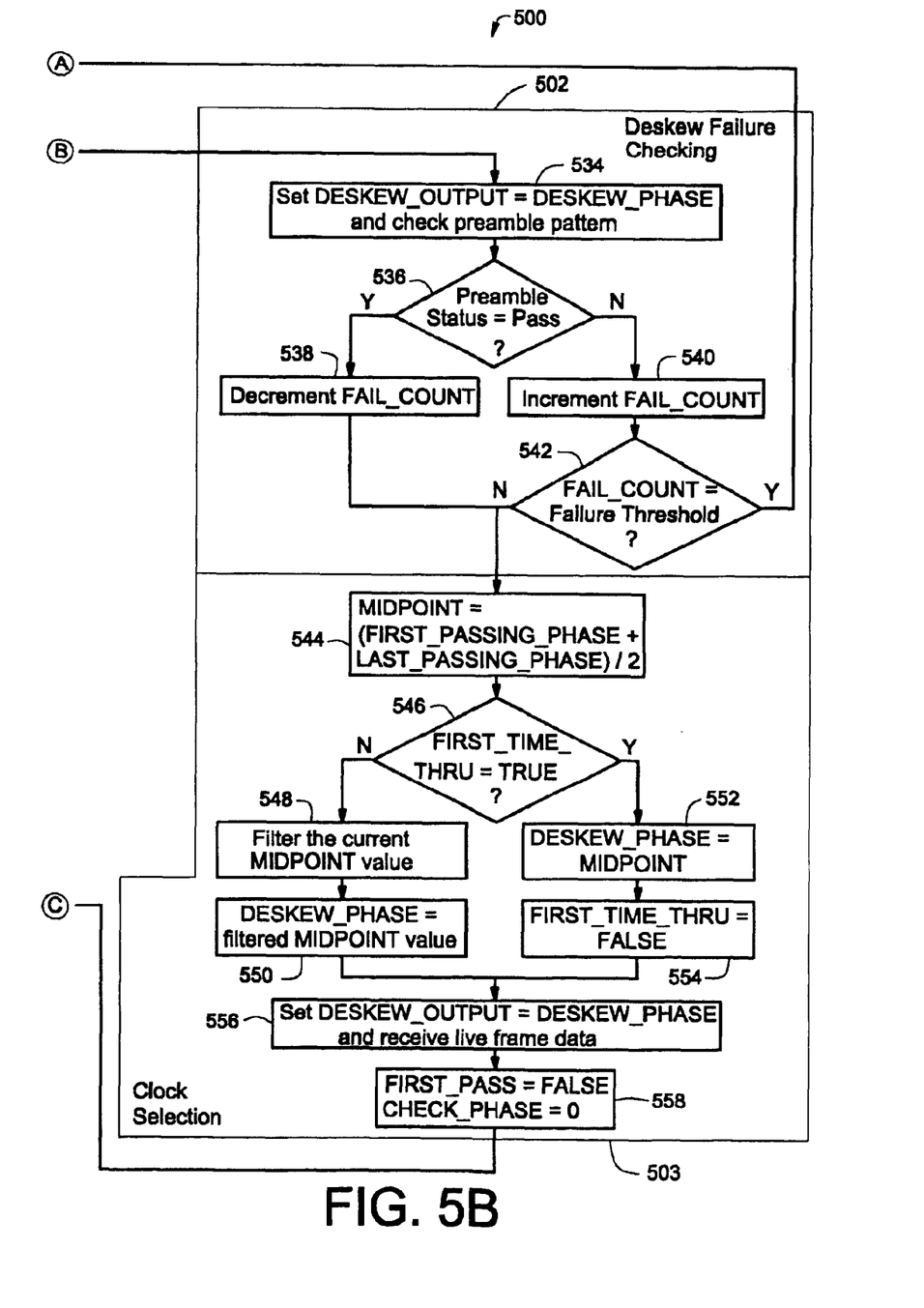

FIG. 5 is an illustration of a flow diagram (500) for an example deskewing methodology. The methodology is broken into three phases: a skew checking phase (501), a failure checking phase (502), and a clock selection phase (503).

The skew checking phase (501) is performed for each of the available clock signals (i.e., the clock phases) during different Execute Deskew intervals. During the skew checking phase, data is sampled using the selected clock signal, and the sampled data is compared to the desired preamble pattern for accuracy. The skew checking phase also decides which clock signals correspond to the first and last passing phases for the sampled data. The failure checking phase (502) is arranged to reevaluate the last selected clock signal and decide whether the system is properly operating as a failsafe check. The clock selection phase (503) is arranged to select the appropriate clock signal based on historical data and the results of the skew checking phase (501) when the failsafe check by the failure checking phase (502) is passed.

Processing for the example deskewing method begins at start block 510. Processing proceeds from start block 510 to block 512, where a series of parameters are initialized. Example parameters are described as follows. The CHECK_PHASE parameter identifies the current clock signal (DLL phase) that is under test, and is initialized to zero. The DESKEW_PHASE parameter corresponds to the last selected most appropriate clock signal (e.g., from a prior selection), and is initialized to a default value. The DESKEW_OUTPUT parameter is an indexing parameter that is used to vary the currently selected clock signal, and is initialized to DESKEW_PHASE. The DESKEW_OUTPUT parameter is also used during "live" data sampling. A failure counter represented by FAIL_COUNT is initialized to zero. The Boolean flag FIRST_PASS is initialized to false. FIRST_PASS is true when a pass has occurred when testing against the preamble. The flag FIRST_TIME_THRU is initialized to TRUE. FIRST_TIME_THRU is a Boolean value that represents whether the current pass is the first pass through algorithm 500.

Processing flows from block 512 to block 514, which corresponds to the first block for example skew checking phase 501. At block 514, algorithm 500 waits for the Execute Deskew interval. Processing then proceeds from block 514 to decision block 516. At decision block 516, algorithm 516 evaluates whether all of the DLL phases have been tested. Processing proceeds from decision block 516 to block 534 when all of the DLL phases have been checked. Failure checking phase 502 is an optional phase that is not necessary in every implementation. When failure checking is disabled or not implemented, processing proceeds from decision block 534 to block 544 when all of the DLL phases have been tested.

Processing proceeds from decision block 516 to block 517 when all of the DLL phases have not been checked. At block 517, the DESKEW_OUTPUT value is set to CHECK_PHASE, which corresponds to the clock signal that is under evaluation. The preamble pattern is also tested at block 517. The preamble status is set to the "pass" state when the sampled data match the expected preamble pattern. Otherwise, the preamble status is set to the "fail" state when the sampled data fails to match the expected preamble pattern. Processing then proceeds from block 517 to decision block 518, where the current pass is evaluated.

Processing proceeds from decision block 518 to decision block 526 when FIRST_PASS is true. FIRST_PASS is true when a first passing phase has previously been detected since the current test sequence of all phases was initiated. Alternatively, processing proceeds from decision block 518 to decision block 520 when FIRST_PASS is false. At decision block 520, algorithm 500 reviews the status of the preamble pattern evaluation. Processing proceeds from decision block 520 to block 530 when the preamble status is in a fail state. Alternatively, processing proceeds from decision block 520 to block 522 when the preamble status is in a pass state. At block 522, FIRST_PASSING_PHASE is set to CHECK_PHASE. The value of FIRST_PASSING_PHASE represents the first DLL phase that passed evaluation. Processing then proceeds from block 522 to block 524. At block 524, FIRST_PASS is set to TRUE, indicating that a first passing phase has been detected.

At decision block 526, algorithm 500 reviews the status of the preamble pattern evaluation. Processing proceeds from decision block 526 to block 530 when the preamble status is in a fail state. Alternatively, processing proceeds from decision block 526 to block 528 when the preamble status is in a pass state. At block 528, LAST_PASSING_PHASE is set to CHECK_PHASE. The value of LAST_PASSING_PHASE represents the last DLL phase that passed evaluation. LAST_PASSING_PHASE is updated when a subsequent phase passes evaluation. Processing then proceeds from block 528 to block 530. At block 530, CHECK_PHASE is incremented. Processing then proceeds from block 530 to block 532. At block 532, DESKEW_OUTPUT is set to DESKEW_PHASE. "Live" data may be received after block 532.

Block 534 corresponds to the first block for example deskew failure checking 503. At block 534, DESKEW_OUTPUT is set to DESKEW_PHASE. The preamble pattern is also tested at block 534. The test at block 534 is substantially similar to the test at block 517. Processing then proceeds from block 534 to decision block 536. At decision block 536, algorithm 500 reviews the status of the preamble pattern evaluation. Processing proceeds from decision block 536 to block 538 when the preamble status is in a pass state. Alternatively, processing proceeds from decision block 536 to block 540 when the preamble status is in a fail state. At block 540, algorithm 500 increments FAIL_COUNT. The process then proceeds from block 540 to decision block 542. At decision block 542, algorithm 500 evaluates whether FAIL_COUNT has reached a pre-determined failure threshold. Processing proceeds from decision block 542 to block 512 when FAIL_COUNT has reached the failure threshold. Alternatively, processing proceeds from decision block 542 to block 544 when FAIL_COUNT has not reached the failure threshold.

At block 538, FAIL_COUNT is decremented. Processing then proceeds from block 538 to block 544, which corresponds to the first block for example clock selection phase 203. At block 544, a MIDPOINT parameter is set to the arithmetic mean of FIRST_PASSING_PHASE and LAST_PASSING_PHASE. Processing then proceeds from block 544 to decision block 546, where the current pass is evaluated. Processing proceeds from decision block 546 to block 552 when the current sequence through algorithm 500 is the first pass through algorithm 500. Alternatively, processing proceeds from decision block 546 to block 548 when the current pass through algorithm 500 is not the first pass through algorithm 500. At block 548, midpoint filtering is performed on the MIDPOINT value. Midpoint filtering is a process that prevents spurious events (e.g. jittery signals) from modifying the DESKEW_PHASE. Midpoint filter is described in further detail below with reference to FIG. 6. Processing then proceeds from block 548 to block 550. At block 550, DESKEW_PHASE is set to the filtered MIDPOINT value. Processing then proceeds from block 550 to block 556.

At block 552, DESKEW_PHASE is set to the value of MIDPOINT. Processing then proceeds from block 552 to block 554. At block 554, FIRST_TIME_THRU is set to FALSE. Processing then proceeds from block 554 to block 556. At block 556, DESKEW_OUTPUT is set to DESKEW_PHASE. "Live" data may be received after block 556. Processing then proceeds from block 556 to block 558. At block 558, FIRST_PASS is set to FALSE, and CHECK_PHASE is set to zero. Processing the proceeds from block 558 to block 514.

In the example illustrated in FIG. 5, Skew checking act 501 samples the preamble with each of the DLL phases. One DLL phase may be checked per data frame. Alternatively, multiple DLL phases may be checked in each data frame. For example, after processing is complete at block 530 processing may alternatively proceed to decision block 516 (rather than block 532). Proceeding to block 516 rather than block 532 allows additional DLL phases to be checked within each data frame at the expense of increasing the overhead of the "adjustment" phase of the frame.

The purpose of failure detection act 502 is detect whether the deskew function is operating correctly and react accordingly. For example, a sudden change in clock frequency may occur. Algorithm 500 detects that the deskew function is not operating correctly. Algorithm 500 responds when algorithm 500 detects that the deskew algorithm is not operating correctly. Algorithm 500 may respond, for example, by resetting the DLL and deskew algorithm to re-acquire a lock on the incoming clock and data. One method of failure detection monitors the preamble status when the preamble data is sampled using DDA's computed best choice of sample phase (DESKEW_PHASE).

In the example of algorithm 500 illustrated in FIG. 5, failure checking act 502 is implemented by testing DESKEW_PHASE. A failure of the test causes a counter (FAIL_COUNT) to increment. Subsequent failures of this test will continue to increment FAIL_COUNT until a predefined threshold is reached. The DLL and DDA are reset and a complete re-acquisition is initiated when the predefined threshold is reached. FAIL_COUNT is decremented when FAIL_COUNT is non-zero and the failure detection passes. Therefore, multiple consecutive failures are required to declare a failure condition. The example of failure checking act 502 illustrated in FIG. 5 prevents spurious preamble checking results from producing false failure conditions. Alternatively, other examples of failure checking act 502 may be used, or failure checking act 502 may be excluded.

According to the example of algorithm 500 illustrated in FIG. 5, DLL phase selection act 503 chooses the appropriate DLL phase to use as the data sampling clock. The choice of which phase to use may be based on the FIRST_PASSING_PHASE and LAST_PASSING_PHASE captured during the M-line algorithm cycle. According to the example of algorithm 500 illustrated in FIG. 5, the sampling objective is to center-sample the data eye to minimize the bit-error rate. This sampling objective is met by evaluating the midpoint, or average, of the FIRST_PASSING_PHASE and LAST_PASSING_PHASE values. At the completion of the first cycle through DDA after a reset (indicated by FIRST_TIME_THRU), DESKEW_PHASE is set to the computed MIDPOINT value of the current algorithm cycle. However, on subsequent cycles through the DDA, the computed MIDPOINT is filtered prior updating the DESKEW_PHASE value.

Many alternatives to the example embodiment of process 500 described above are within the scope of invention. According to one alternative embodiment, DLL phase selection act 503 may be performed without filtering the midpoint value. According to this alternative embodiment, processing proceeds from block 544 to block 552.

Algorithm 500 has many possible applications. For example, algorithm 500 may be applied to a display system. According to one example in which algorithm 500 is applied to a display system, each data frame consists of one line of graphics data. Alternatively, algorithm 500 may be used for other applications. Algorithm 500 may be implemented as hardware logic. Alternatively, algorithm 500 may be implemented in other ways (e.g. software).

Figure 6:
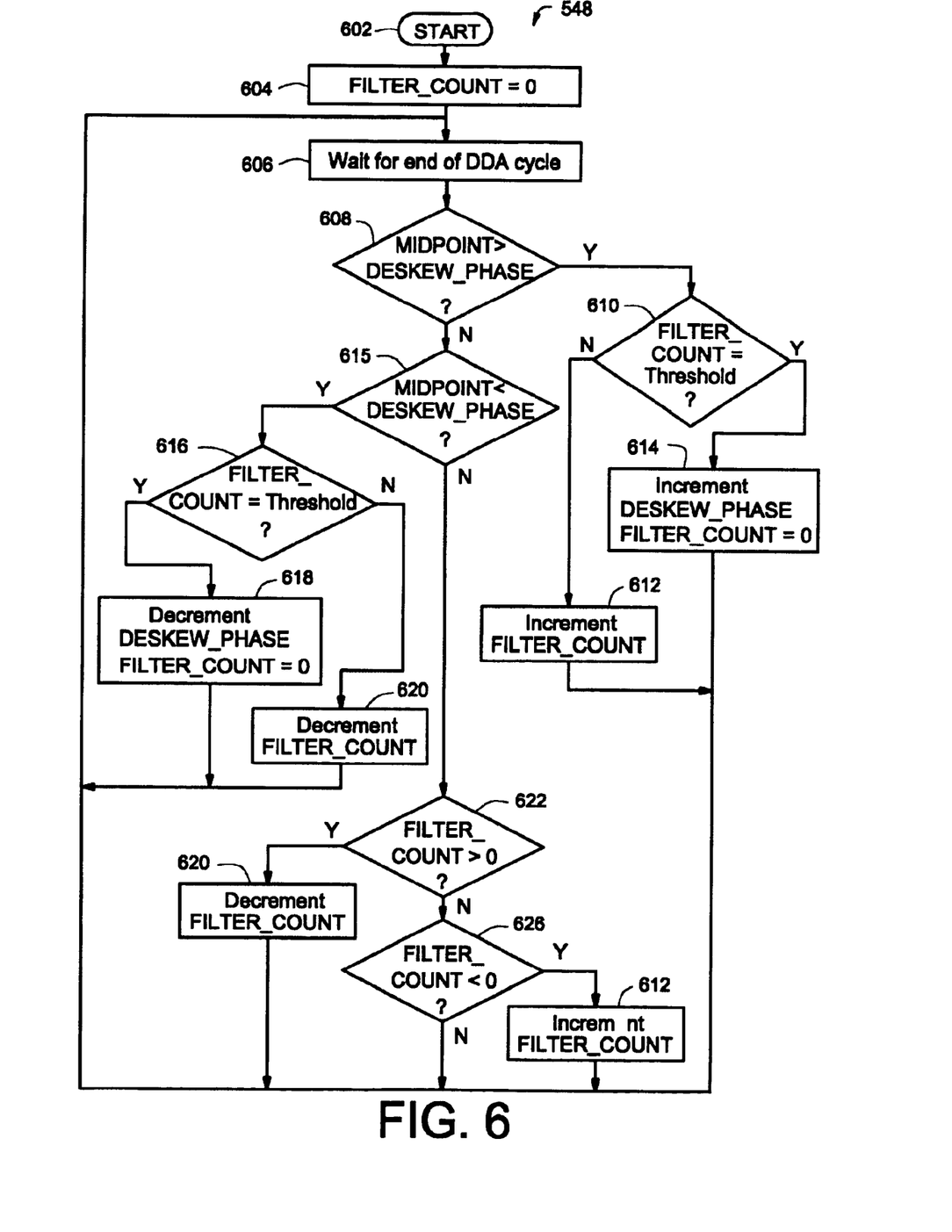
FIG. 6 is an illustration of a flow diagram for an example midpoint filtering methodology, in accordance with aspects of the present invention.

FIG. 6 is an illustration of a flow diagram for an example midpoint filtering methodology, in accordance with aspects of the present invention. The example embodiment of process 548 illustrated in FIG. 6 requires minimal circuitry, but efficiently performs a deskew filtering function.

DESKEW_PHASE is adjusted only when a bi-directional counter (FILTER_COUNT) reaches a positive or negative threshold value. FILTER_COUNT is incremented when MIDPOINT is greater than DESKEW_PHASE, and FILTER_COUNTER is decremented when MIDPOINT is less than DESKEW_PHASE. FILTER_COUNT counts toward zero when MIDPOINT is equal to DESKEW_PHASE. Accordingly, DESKEW_PHASE is adjusted only when MIDPOINT is consistently greater or less than DESKEW_PHASE.

Example Midpoint Filtering Methology

Processing for the example midpoint filtering method begins at start block 602. Processing then proceeds from start block 602 to block 604. At block 604, FILTER_COUNT is initialized to zero. Processing then proceeds from block 604 to block 606. At block 606, process 548 waits for the end of the DDA cycle. Processing then proceeds from block 606 to decision block 608. At decision block 608, process 548 evaluates whether MIDPOINT is greater than DESKEW_PHASE. Processing proceeds from decision block 608 to decision block 610 when MIDPOINT is greater than DESKEW_PHASE. Alternatively, processing proceeds from decision block 608 to decision block 615 when MIDPOINT is not greater than DESKEW_PHASE. At decision block 615, process 548 evaluates whether MIDPOINT is less than DESKEW_PHASE. Processing proceeds from decision block 615 to decision block 616 when MIDPOINT is less than DESKEW_PHASE. Alternatively, processing proceeds from decision block 615 to decision block 622 when MIDPOINT is not less than DESKEW_PHASE.

At decision block 616, process 548 evaluates whether FILTER_COUNT has reached a negative filter threshold. Processing proceeds from decision block 616 to block 618 when FILTER_COUNT has reached the negative filter threshold. Alternatively, processing proceeds from decision block 616 to block 620 when FILTER_COUNT has not reached the negative threshold. At block 620, FILTER_COUNT is decremented. Processing then proceeds from block 620 to block 606. At block 618, DESKEW_PHASE is decremented and FILTER_COUNT is set to zero. Processing then proceeds from block 618 to block 606.

At decision block 610, process 548 evaluates whether FILTER_COUNT has reached a positive filter threshold. Processing proceeds from decision block 610 to block 614 when FILTER_COUNT has reached the positive filter threshold. Alternatively, processing proceeds from decision block 610 to block 612 when FILTER_COUNT has not reached the positive threshold. At block 612, FILTER_COUNT is incremented. Processing then proceeds from block 612 to block 606. At block 614, DESKEW_PHASE is incremented at FILTER_COUNT is set to zero. Processing then proceeds from block 614 to block 606.

At decision block 622, process 548 evaluates whether FILTER_COUNT is greater than zero. Processing proceeds from decision block 622 to block 620 when FILTER_COUNT is greater than zero. Alternatively, processing proceeds from decision block 622 to block 626 when FILTER_COUNT is not greater than zero. At decision block 626, process 548 evaluates whether FILTER_COUNT is less than zero. Processing proceeds from decision block 626 to block 612 when FILTER_COUNT is less than zero. Alternatively, processing proceeds from decision block 626 to block 606 when FILTER_COUNT is not less than zero.

The above specification, examples and data provide a complete description of the manufacture and use of the composition of the invention. Since many embodiments of the invention can be made without departing from the spirit and scope of the invention, the invention resides in the claims hereinafter appended.

We claim:

1. A method of deskewing an input clock signal to produce a deskewed clock signal such that the deskewed clock signal is aligned relative to input data, the method comprising:

selecting a clock signal from a plurality of clock signals to provide a selected clock signal, wherein each of the plurality of clock signals corresponds to a delayed version of the input clock signal and wherein the selected clock signal is related to a first edge of the input clock;

testing the selected clock signal, wherein the selected clock signal is tested by retrieving input data with the selected clock signal to provide retrieved data, and comparing the retrieved data to a known data sequence to provide a test result;

evaluating the test results to determine a most appropriate one of the plurality of clock signals; and selecting the most appropriate one of the plurality of clock signals as the deskewed clock signal.

2. The method as in claim 1, further comprising selecting a second clock signal from of the plurality of clock signals to provide a second selected clock signal, wherein the second selected clock signal is related to another edge of the input clock signal, and wherein testing further comprises testing the second selected clock signal.

3. The method as in claim 1, wherein retrieving input data comprises sampling the input data with the selected clock signal to provide the retrieved data.

4. The method as in claim 1, further comprising: generating the plurality of clock signals with a delay-locked loop such that each of the plurality of clocks signals is delayed relative to the input clock signal, and such that the plurality of clock signals span an integral number of data bit periods.

5. The method as in claim 1, wherein testing each selected clock signal further comprises:

waiting for an execute deskew interval;

sampling the input data during the execute deskew interval with the selected clock signal to provide the retrieved data, wherein the input data corresponds to the known data sequence during the execute deskew interval;

determining when the test result corresponds to a least delayed phase; and determining when the test result corresponds to a most delayed phase.

6. The method as in claim 1, wherein evaluating the test results comprises: locating a range, wherein the range is associated with indexes to clocks signals that yield passing test results; and determining a position within the range, wherein the position is selected based on set-up and hold times of an apparatus that provides the retrieved data, and wherein the position is evaluated as the index to the most appropriate one of the plurality of clock signals.

7. The method as in claim 1, wherein evaluating the test results comprises:

locating a midpoint of a range, wherein the range is associated with indexes to clocks signals that yield passing test results, and wherein a particular clock signal is associated with the midpoint of the range;

determining whether the deskewed clock signal was previously selected;

evaluating the particular clock signal as the most appropriate one of the plurality of clock signals when the deskewed clock signal was previously unselected;

filtering the midpoint when the deskewed clock signal was previously selected, wherein the filtered midpoint is associated with another index to another particular clock signal; and evaluating the other particular clock signal as the most appropriate one of the plurality of clock signals when the deskewed clock signal was previously selected, wherein the filtered midpoint is one of: the same as the midpoint and different from the midpoint.

8. The method as in claim 7, wherein filtering the midpoint comprises: initializing a filter counter to zero;

determining a first condition is satisfied when the midpoint is associated with a last index, wherein the last index is associated with the last selected deskewed clock signal;

increasing a filter counter when the previous value of the filter counter is less than zero and the first condition is satisfied;

decreasing the filter counter when the previous value of the filter counter is greater than zero and the first condition is satisfied;

determining a second condition is satisfied when the midpoint is greater than the last index;

increasing the filter counter when the previous value of the filter counter is less than a positive filter threshold and the second condition is satisfied;

setting the filtered midpoint to the sum of the last index and an increment value when the previous value of the filter counter is equal to the positive filter threshold and the second condition is satisfied;

setting the filter count to zero when the previous value of the filter counter is equal to the positive filter threshold and the second condition is satisfied;

determining a third condition is satisfied when the midpoint is less than the last index;

decreasing the filter counter when the previous value of the filter counter greater than a negative filter threshold and the third condition is satisfied;

setting the filtered midpoint to the difference of the last index and a decrement value when the previous value of the filter counter is equal to the negative filter threshold and the third condition is satisfied; and setting the filtered midpoint to zero when the previous value of the filter counter is equal to the negative filter threshold and the third condition is satisfied.

9. The method as in claim 1, wherein testing each selected clock signal further comprises:

waiting for an execute deskew interval;

sampling the input data during the execute deskew interval with the selected clock signal to provide the retrieved data, wherein the input data corresponds to the known data sequence during the execute deskew interval;

determining when the test result corresponds to a least delayed phase; and determining when the test result corresponds to a most delayed phase; and wherein evaluating the test results comprises:

locating a midpoint of a range, wherein the range is associated with indexes to clocks signals that yield passing test results, and wherein a particular clock signal is associated with the midpoint of the range;

evaluating whether the deskewed clock signal was previously selected;

determining the particular clock signal as the most appropriate one of the plurality of clock signals when the deskewed clock signal was previously unselected;

filtering the midpoint when the deskewed clock signal was previously selected, wherein the filtered midpoint is associated with another index to another particular clock signal; and determining the other particular clock signal as the most appropriate one of the plurality of clock signals when the deskewed clock signal was previously selected, wherein the filtered midpoint is one of: the same as the midpoint and different from the midpoint.

10. The method as in claim 1, further comprising performing a failure check on the deskewed clock signal.

11. The method as in claim 1, further comprising:

waiting for an execute deskew interval;

sampling the input data during the execute deskew interval with the deskewed clock signal to provide sampled input data, wherein the input data corresponds to the known data sequence during the execute deskew interval;

comparing the sampled input data to the known data sequence;

decrementing a failure counter when the sampled input data matches the known data sequence;

incrementing the failure counter when the sampled input data does not match the known data sequence;

evaluating the failure counter to determine when the failure counter is equal to a pre-determined failure threshold; and re-initializing the method when the failure counter is equal to the predetermined failure threshold.

12. The method as in claim 1, further comprising:

generating the plurality of clock signals with a delay-locked loop such that each of the plurality of clocks signals is delayed relative to the input clock signal, and such that the plurality of clock signals span an integral number of data bit periods;

wherein testing each selected clock signal further comprises:

waiting for an execute deskew interval, determining whether each of the plurality of clock signals has been tested, when each of the plurality of clock signals has not been tested:

sampling the input data with the selected clock during the execute deskew interval to provide the retrieved data, wherein the input data corresponds to the known data sequence during the execute deskew interval, determining whether the test result corresponds to a least delayed phase, and determining whether the test result corresponds to a most delayed phase;

performing a failure check during the execute deskew interval after the plurality of clock signals has been tested, comprising:

sampling the input data with the deskewed clock signal to provide sampled input data;

comparing the sampled input data to the known data sequence after sampling the input data;

decrementing a failure counter when the sampled input data matches the known data sequence;

incrementing the failure counter when the sampled input data does not match the known data sequence;

evaluating the failure counter to determine when the failure counter is equal a pre-determined failure threshold; and re-initializing the method when the failure counter is equal to the predetermined failure threshold; and wherein evaluating the test results comprises:

locating a midpoint of a range when each of the plurality of clock signals have been tested, wherein the range is associated with indexes to clocks signals that yield passing test results, and wherein a particular clock signal is associated with the midpoint of the range; and after locating the midpoint:
  determining whether the deskewed clock signal has been selected;
  when the deskewed clock was previously unselected:
    evaluating the particular clock signal as the most appropriate one of the plurality of clock signals;
  when the deskewed clock was previously selected:
    filtering the midpoint, wherein the filtered midpoint is associated with another index to another particular clock signal; and
    evaluating the other particular clock signal as the most appropriate one of the plurality of clock signals, wherein the filtered midpoint is one of the same as the midpoint and different from the midpoint.

13. An apparatus for deskewing an input clock signal to produce a deskewed clock signal such that the deskewed clock signal is aligned relative to input data, the apparatus comprising:
  a delay-lock loop circuit that is configured to provide a selected clock signal in response to an input clock signal and a clock select signal;
  a data sampling block that is configured to provide a sampled data signal in response to the input data and the selected clock signal;
  a preamble pattern check block that configured to compare the sampled data signal to a known data sequence, and further configured to produce a test result based on the comparison; and
  a deskew control block that is configured to adjust the clock select signal in response to the test result according to a deskew algorithm.

14. The apparatus as in claim 13, wherein the delay-locked loop circuit is further configured to produce a plurality of clock phases, wherein each of the plurality of clock phases corresponds to a delayed version of the input clock signal, wherein the selected clock signal corresponds to one of the plurality of clock phases, wherein the deskew algorithm is configured to evaluate at least one test result and determine a selected phase that corresponds to a most appropriate selection from the plurality of clock phases, such that the deskew control block adjusts the clock select signal according to the selected phase.

15. The apparatus as in claim 13, wherein the input data is arranged according to a protocol such that the input data includes: control information during a header phase, a preamble pattern during an execute deskew phase, and a live data block during a transmit data phase, wherein the preamble pattern corresponds to a known data sequence that includes variations in phase and bit width such that various transmission errors can be tested.

16. The apparatus as in claim 13, wherein:
  the deskew control block is further configured to adjust a second clock select signal in response to the test result according to the deskew algorithm;
  the delay-lock loop circuit is further configured to provide a second selected clock signal in response to the input clock signal and the second clock select signal; and
  the data sampling block that is configured to provide part of the sampled data signal in response to the input data and the selected clock signal, and the data sampling block is further configured to provide another part of the sampled data signal in response to the input data and the second selected clock signal.

17. An apparatus for deskewing an input clock signal to produce a deskewed clock signal such that the deskewed clock signal is aligned relative to an input data signal, the apparatus comprising:
  a delay-lock loop circuit that is configured to provide a selected clock phase in response to an input clock signal and a clock select signal; and
  a means for clock deskewing that is configured to receive the input data signal and the input clock signal, wherein the means for clock deskewing is configured to cooperate with the delay-locked loop circuit to provide the deskewed clock signal during a transmit data interval based, in part, on a known data sequence that occurs in the input data signal during an adjustment interval.

18. An apparatus comprising:
  a delay-lock loop circuit, comprising:
    a means for selecting a selected clock phase that is arranged to select at least one of a plurality of clock phases as the selected clock phase in response to a clock select signal;
    a means for generating the plurality of clock phases, and
    a means for adjusting a delay that is associated with each of the plurality of clock phases, wherein the means for generating is arranged in cooperation with the means for adjusting such that the plurality of clock phases span an integral number of data bit periods; and
  a means for clock deskewing, comprising:
    a means for skew checking that is configured to test each selected clock phase, wherein the means for skew checking comprises:
      a means for retrieving that is configured to retrieve an input data signal with the selected clock phase to provide retrieved data, and
      a means for comparing that is configured to compare the retrieved data to a known data sequence to provide a test result;
    a means for evaluating that is configured to evaluate the test results to determine a most appropriate one of the plurality of clock phases; and
    a means for adjusting the clock select signal that is arranged to adjust the clock select signal such that a deskewed clock signal corresponds to the most appropriate one of the plurality of clock phases.

19. The apparatus as in claim 18, wherein the means for evaluating comprises:
  a means for locating that is configured to locate a midpoint of a range, wherein the range is associated with indexes to clock phases that yield passing test results, and wherein a particular clock phase is associated with the midpoint of the range;
  a means for determining that is configured to determine whether the deskewed clock signal was previously selected;
  a second means for evaluating that is configured to evaluate the particular clock phase as the most appropriate one of the plurality of clock phases when the deskewed clock signal was previously unselected;
  a means for filtering that is configured to filter the midpoint when the deskewed clock signal was previously selected, wherein the filtered midpoint is associated with another index to another particular clock phase; and
  a third means for evaluating that is configured to evaluate the other particular clock phase as the most appropriate one of the plurality of clock phases when the deskewed clock signal was previously selected, wherein the filtered midpoint is one of: the same as the midpoint and different from the midpoint.

20. The apparatus as in claim 18, wherein the means for retrieving comprises:

a means for sampling that is configured to sample the input data signal with the selected clock phase to provide the retrieved data.

* * * * *

UNITED STATES PATENT AND TRADEMARK OFFICE
CERTIFICATE OF CORRECTION

PATENT NO.   : 6,861,886 B1
DATED        : March 1, 2005
INVENTOR(S)  : Christopher A. Ludden et al.

It is certified that error appears in the above-identified patent and that said Letters Patent is hereby corrected as shown below:

Drawings,
Sheet 6 of 8, Block 532 (FIG. 5A), line 2, delete "receiv liv" and insert -- receive live --.
Sheet 8 of 8, Block 612 (FIG. 6), line 1, delete "Increm nt" and insert -- Increment --.

Column 4,
Line 3, delete "Excute" and insert -- Execute --.
Line 49, delete "flipflops" and insert -- flip-flops --.

Column 12,
Line 60, delete "predetermined" and insert -- pre-determined --.

Signed and Sealed this

Nineteenth Day of July, 2005

JON W. DUDAS
*Director of the United States Patent and Trademark Office*